United States Patent [19]

Yasuda

[11] Patent Number: 5,495,504
[45] Date of Patent: Feb. 27, 1996

[54] SIGNAL GENERATING APPARATUS

[75] Inventor: Akira Yasuda, Kawasaki, Japan

[73] Assignee: Kabushiki Kaisha Toshiba, Kawasaki, Japan

[21] Appl. No.: 143,064

[22] Filed: Oct. 29, 1993

[30] Foreign Application Priority Data

Oct. 30, 1992 [JP] Japan .................................. 4-292306

[51] Int. Cl.$^6$ .................................................. H04L 27/10
[52] U.S. Cl. .......................... 375/281; 375/285; 375/308; 332/103
[58] Field of Search ................................... 375/37, 52, 54, 375/57, 67; 332/103, 144; 381/36, 37, 40

[56] References Cited

U.S. PATENT DOCUMENTS

| | | | |
|---|---|---|---|
| 4,613,976 | 9/1986 | Sewerinson et al. | 375/52 |
| 4,962,510 | 10/1990 | McDavid et al. | 375/67 |
| 5,225,795 | 7/1993 | Iinuma | 375/308 |
| 5,255,288 | 10/1993 | Ichihara | 375/308 |
| 5,303,412 | 4/1994 | Kushner | 332/103 |

FOREIGN PATENT DOCUMENTS 4-313901 11/1992 Japan.

*Primary Examiner*—Stephen Chin
*Assistant Examiner*—Don N. Vo
*Attorney, Agent, or Firm*—Oblon, Spivak, McClelland, Maier & Neustadt

[57] ABSTRACT

A signal generating apparatus comprises a mapping circuit for converting a time-sequential input signal into I and Q signals constituting a QPSK code, a signal holding circuit for dividing each of I and Q signals into a plurality of digital signals, retaining them, and outputting them in parallel, a waveform forming circuit for outputting waveform data items corresponding to the plurality of digital signals from the signal holding circuit, a D/A converter for converting the waveform data items from the waveform forming circuit into a plurality of analog signals, an adder for adding the plurality of analog signals from the D/A converter and outputting a sum signal, and a filter for eliminating unwanted frequency components from the sum signal from the adder.

15 Claims, 11 Drawing Sheets

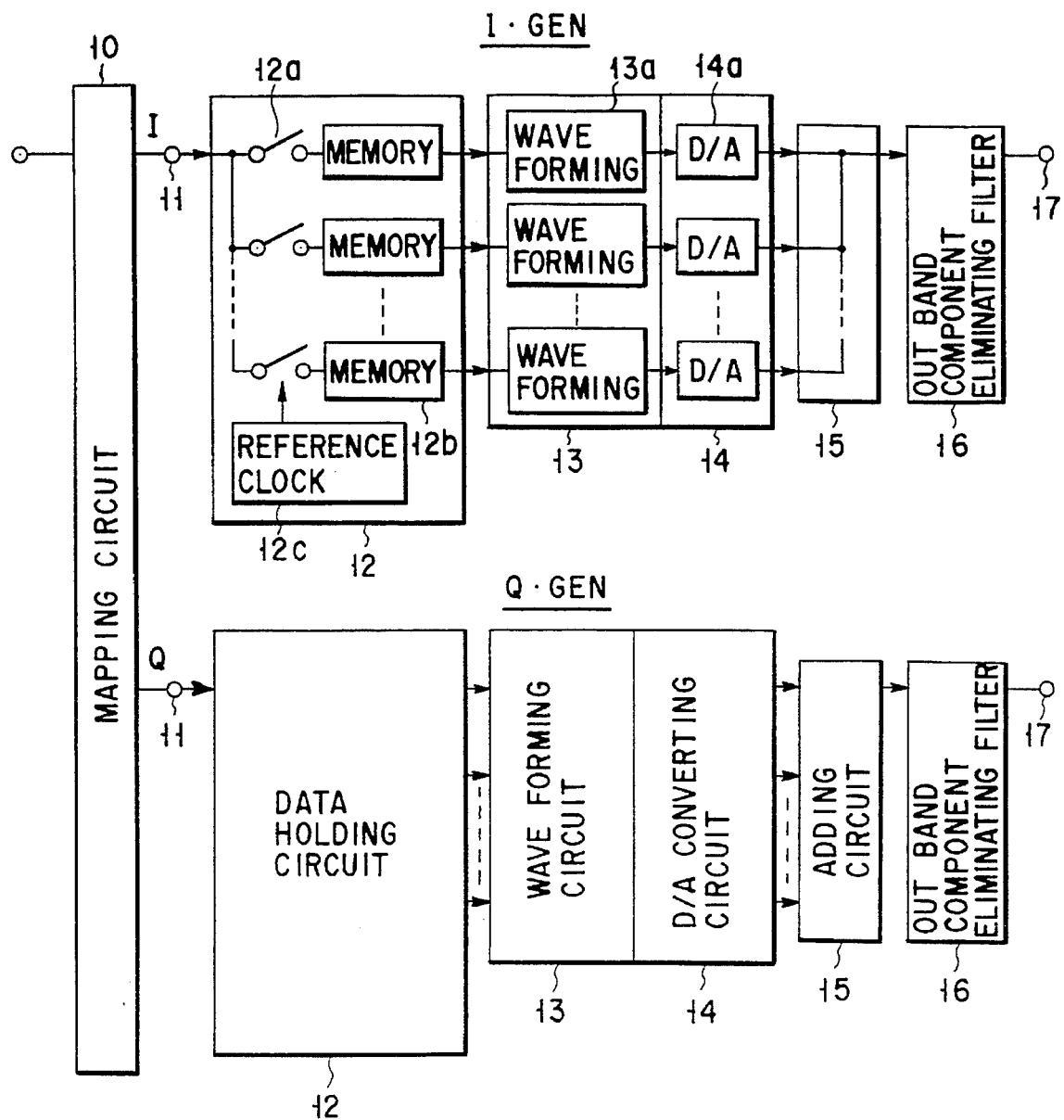
F I G. 1

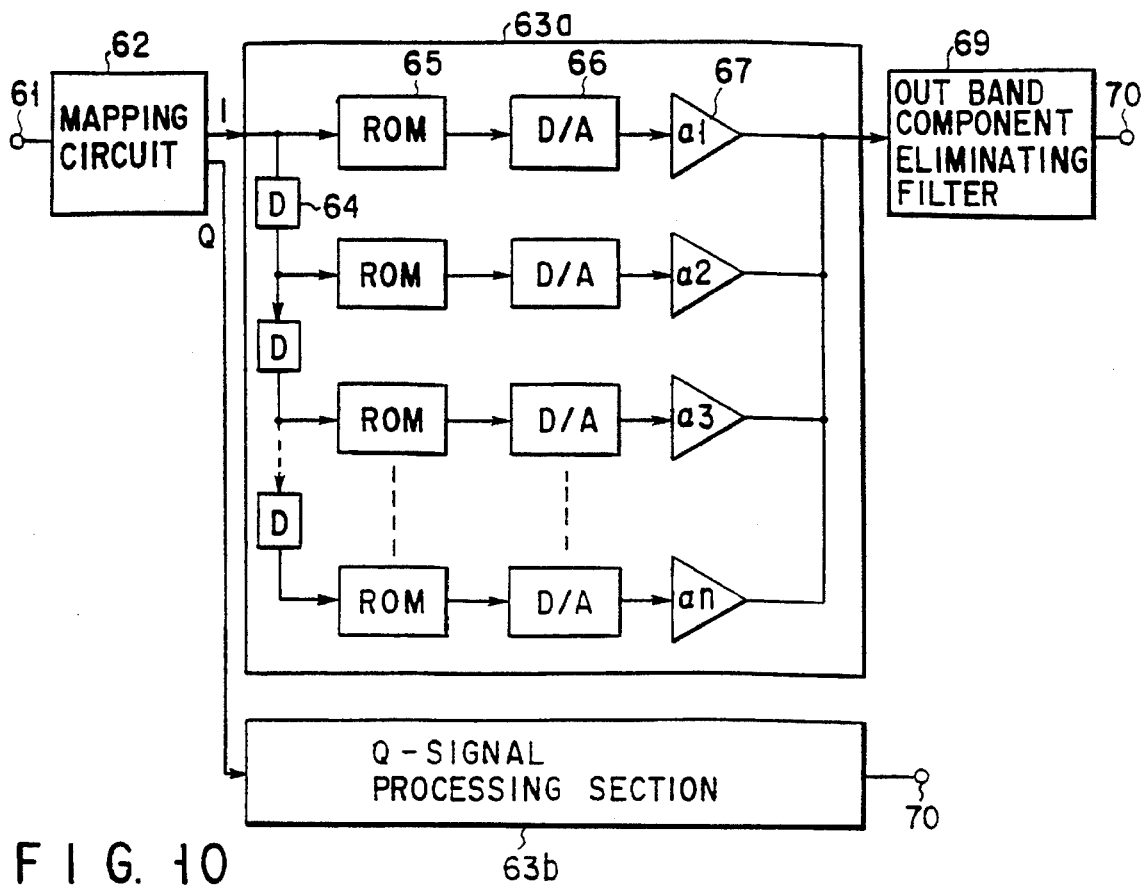
F I G. 10
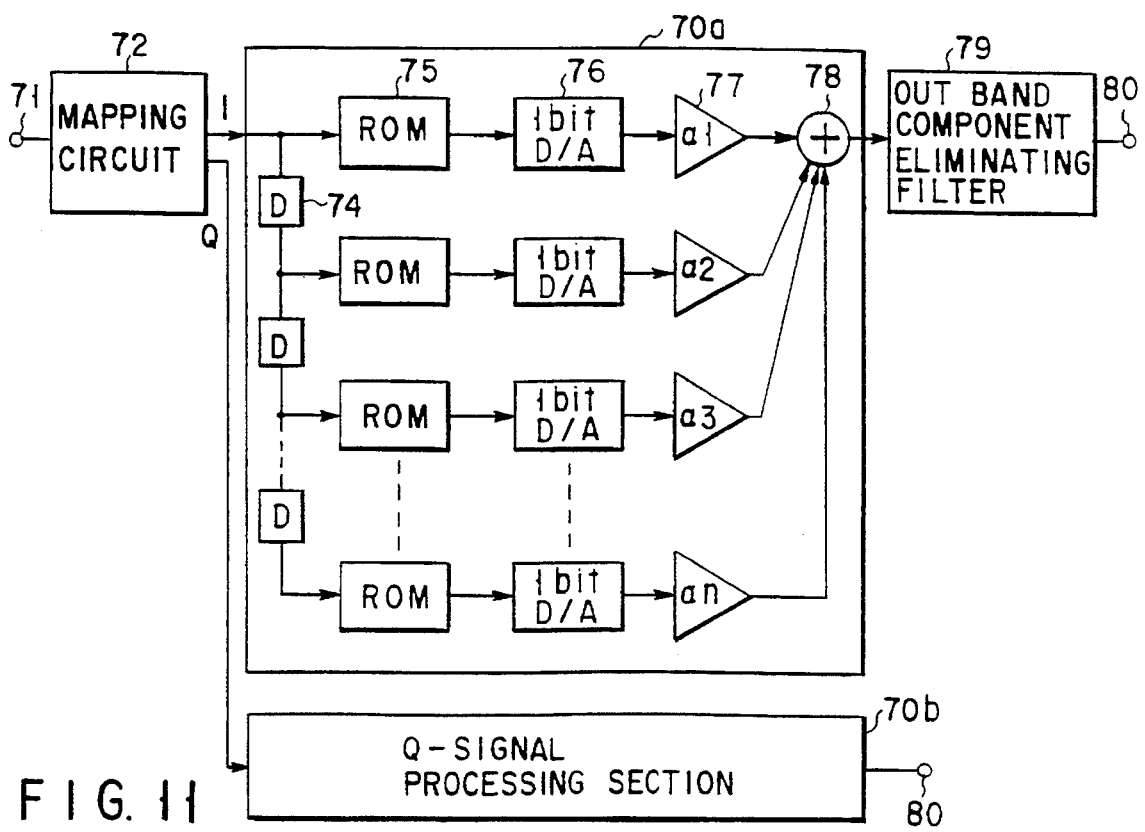
F I G. 11

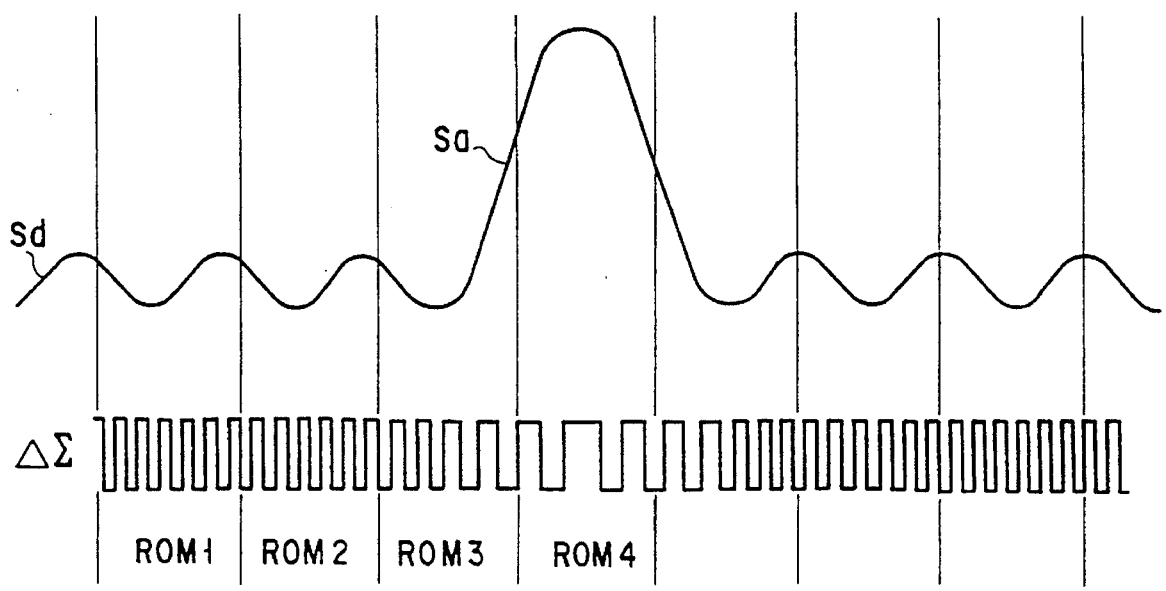
F I G. 12
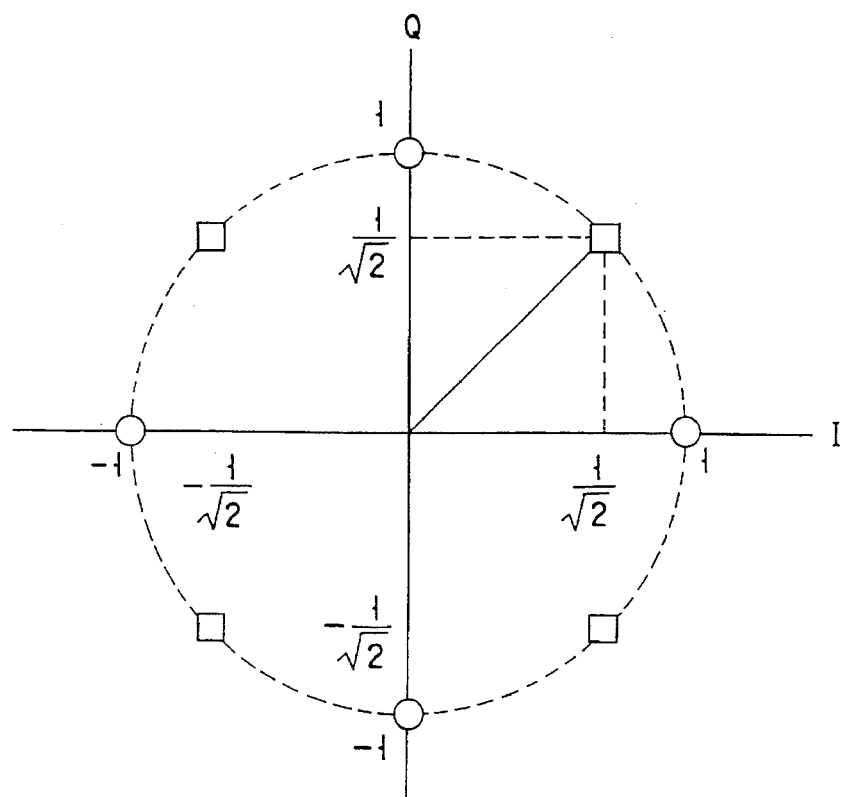
F I G. 13

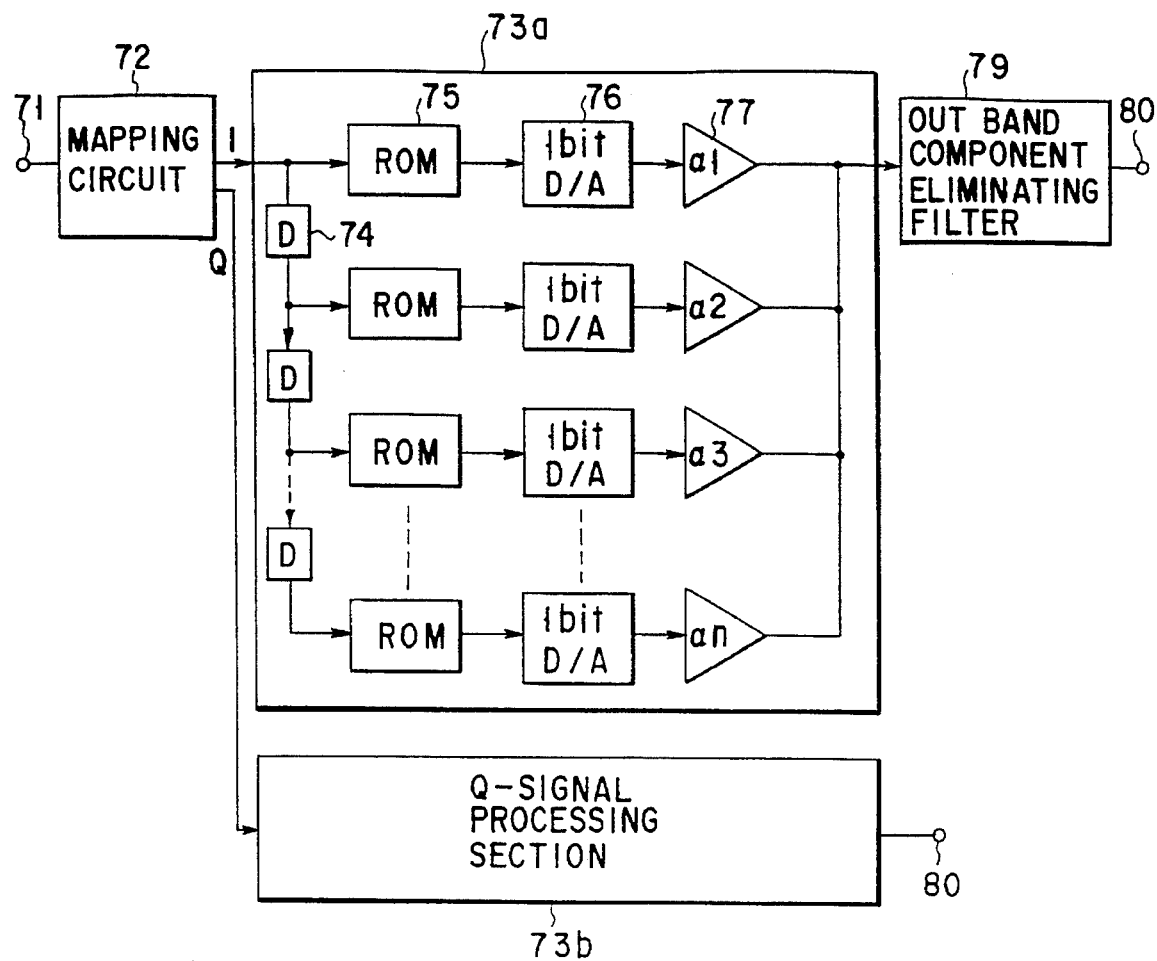
F I G. 15

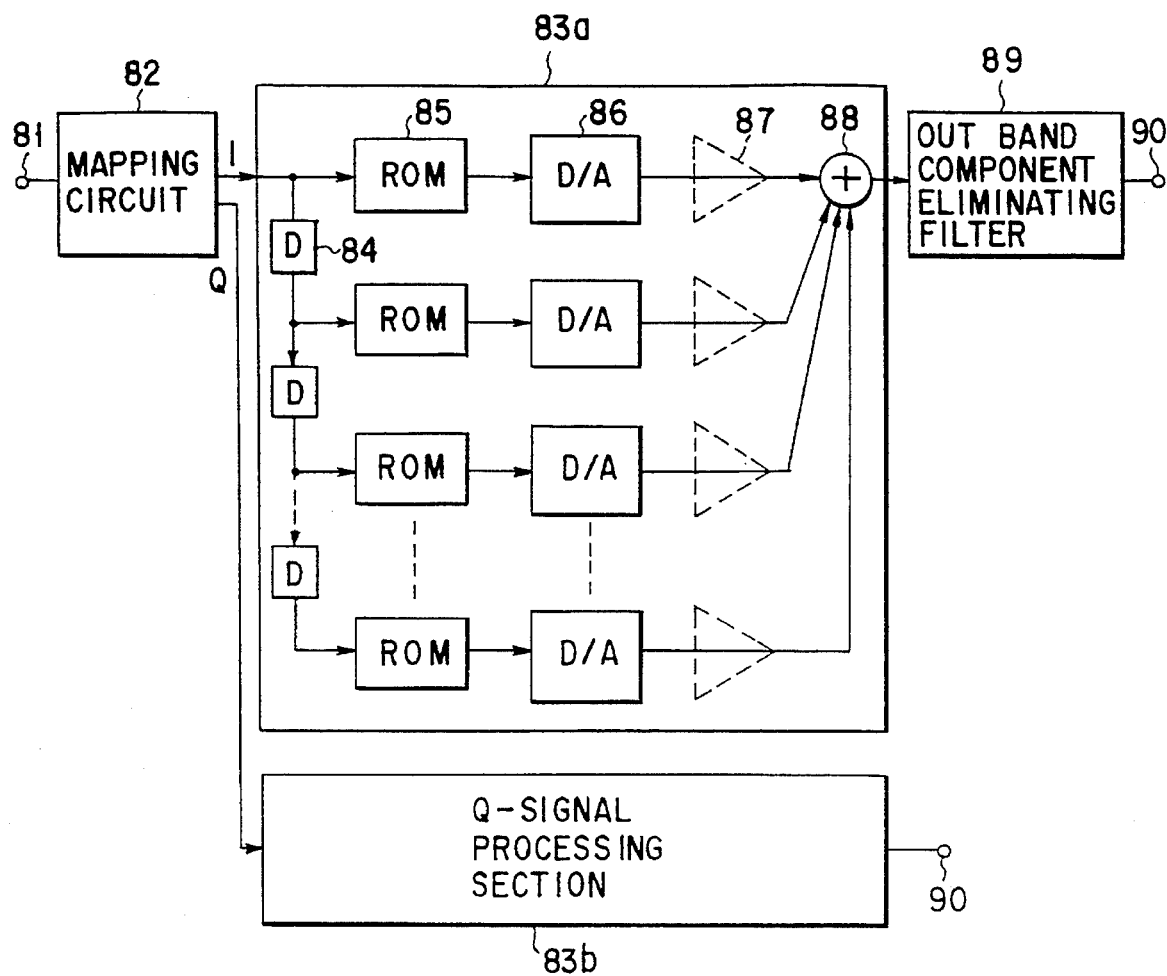
F I G. 16

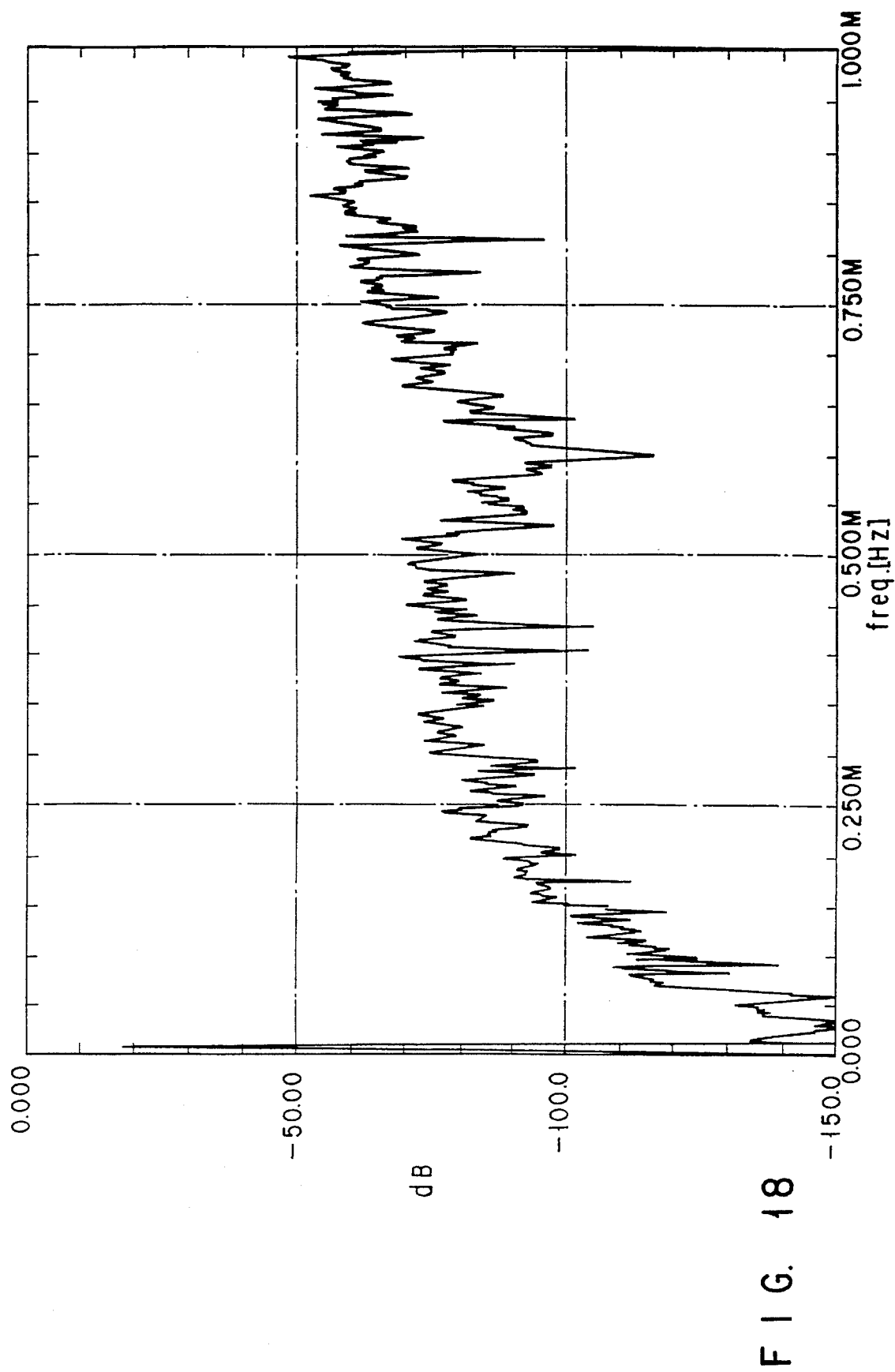
F I G. 18

SIGNAL GENERATING APPARATUS

BACKGROUND OF THE INVENTION

1. Field of the Invention

This invention relates to a signal generating apparatus, and more particularly a QPSK (Quadrature Phase Shift Keying) signal generating apparatus.

2. Description of the Related Art

QPSK codes are used in a modulation system in which time-sequential data is divided into unit data strings and these unit data strings are converted into I-channel and Q-channel signals crossing each other at right angles, to express a state. With these code, it is possible to express four states according to combinations of (I, Q) in the I, Q plane: for example, (0, 0), (1, 0), (0, 1), and (1, 1) (refer to RCR-SRD-27, the Radio System Development Center Foundation).

To generate such a QPSK signal, for example, QPSK signal generators have been used. Time-sequentially supplied digital signals are converted by a mapping circuit into QPSK codes expressed by I and Q signals. The mapping circuit outputs I and Q signals in synchronization with a specific clock and these signals are supplied to a digital roll-off filter to prevent interference between QPSK codes. The output of the digital roll-off filter is converted by a digital-to-analog converter into an analog signal, which is supplied to a low-pass filter to attenuate undesired frequency components. The output of the low-pass filter is the QPSK signal.

The digital roll-off filter is generally realized by an FIR (finite impulse response) or IIR (infinite impulse response) digital filter. These digital filters are made up of digital adders, digital multipliers, or digital delay elements. The scale of these digital circuits is generally large, which is an obstacle to making the QPSK signal generator more compact.

To avoid the obstacle, a method of constructing a QPSK signal generator without using a large digital roll-off filter has been proposed. This method can produce only four kinds of QPSK signals determined by combinations of (I, Q). Thus, by preparing the impulse responses of a digital roll-off filter which correspond to the input signals beforehand, instead of supplying in real time the QPSK signals converted at the mapping circuit to the digital roll-off filter, and only when the input is arrived, supplying the impulse response corresponding to the input signal, the function of the digital roll-off filter can be achieved.

In this case, in order to make the impulse response corresponding to the input signal approximate thereto in real time, the result of adding impulse responses of digital roll-off filters to the extent that an effect on the output signal is sufficiently small, is actually outputted. Because the impulse responses of the digital roll-off filter are bits of digital data, this causes the problem that a large digital adder is required to add these bits.

As mentioned above, when a digital roll-off filter is used, it is difficult to make the entire size of the QPSK signal generator smaller because the digital roll-off filter is composed of a large digital circuit. Also, if a signal generator uses no digital roll-off filter, since it requires an adder for digital data, it is not suitable for making the QPSK signal generator more compact.

As described above, conventional QPSK signal generators need large digital filters. In the case where the function is modified without using digital filters, a large digital adder is required, too. To improve the accuracy of signal, it is necessary to use high-accuracy elements for D/A converter components.

SUMMARY OF THE INVENTION

The object of the present invention is to provide a QPSK signal generating apparatus which neither uses digital filters or digital adders, nor requires high-accuracy elements.

According to a first aspect of the present invention, there is provided a QPSK signal generating apparatus comprising: a signal conversion circuit for converting a time-sequential input signal into a digital signal; a signal holding circuit for retaining pieces of digital signals sequentially supplied from the signal conversion circuit and outputting them in parallel; a waveform forming circuit for outputting the waveform data corresponding to the output signal of the signal holding circuit; a conversion circuit for converting the output of the waveform forming circuit into an analog signal; an addition circuit for adding the analog outputs from the conversion circuit; and an elimination circuit for removing unwanted frequency components from the output of the addition circuit.

According to a second aspect of the present invention, there is provided a QPSK signal generating apparatus comprising: a signal conversion circuit for converting a time-sequential input signal into a digital signal; a signal holding circuit for retaining digital signals sequentially supplied from the signal conversion circuit and outputting them in parallel; a waveform forming circuit for outputting the synthesized waveform data determined by a combination of the output signals of the signal holding circuit; a conversion circuit for converting the synthesized waveform output into an analog signal; and an elimination circuit for removing unwanted frequency components from the output signal of the conversion circuit.

According to a third aspect of the present invention, there is provided a QPSK signal generating apparatus comprising: a signal conversion circuit for converting a time-sequential input signal into a digital signal; a signal holding circuit for retaining pieces of digital signals sequentially supplied from the signal conversion circuit and outputting them in parallel; a plurality of memory circuits for storing the $\Delta\Sigma$ modulation data corresponding to the output signal of the signal holding circuit; a D/A conversion circuit for converting the $\Delta\Sigma$ modulation data supplied from the plurality of memory circuits into an analog signal; and an elimination circuit for removing unwanted frequency components from the output of the conversion circuit.

In a signal generator of the invention, digital data sets including the impulse responses corresponding to the impulses of a digital roll-off filter are prepared, and the digital data items corresponding to the supplied QPSK signals are converted into analog signals, which are supplied to the analog signal adder, which generates a QPSK signal.

In the first aspect of the invention, by adding pieces of analog data, a QPSK signal can be synthesized. This make it possible to construct a QPSK signal generating apparatus smaller in scale than a conventional apparatus with digital adders. Particularly because use of the analog signals obtained by digital-to-analog conversion as current outputs enables the connection of signal lines for current addition, there is no need to provide an analog adder.

The second aspect of the invention has the advantage that the addition result of the impulse responses of the digital roll-off filter is held as data, and the addition result of the impulse responses corresponding to the supplied QPSK signals is supplied.

Because the kinds of the supplied QPSK signal have been known in advance, by providing the waveform forming circuit with the resultant waveforms of the impulse responses corresponding to the kinds, the configuration of the signal generator can be made smaller by the size of the adder eliminated.

According to the third aspect of the invention, the data coded by oversampling at, for example, a $\Delta\Sigma$ type digital-to-analog converter, is used to generate QPSK codes.

Quantizing noise in the band can be reduced by oversampling and noise shaping. In addition, because in-band signals are expressed at high accuracy by single-bit codes, the accuracy of elements for the digital-to-analog converter can be relaxed remarkably. These make it possible to render the scale of the digital-to-analog converter smaller substantially and simplify it.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a block diagram of a signal generating apparatus according to a first embodiment of the present invention;

FIG. 10 is a block diagram of a signal generating apparatus according to a seventh embodiment of the present invention;

FIG. 11 is a block diagram of a signal generating apparatus according to an eighth embodiment of the present invention;

FIG. 12 shows an impulse response and a $\Delta\Sigma$ signal;

FIG. 13 shows an IQ plane;

FIG. 15 is a block diagram of a signal generating apparatus according to a ninth embodiment of the present invention;

FIG. 16 is a block diagram of a signal generating apparatus according to a tenth embodiment of the present invention;

FIG. 18 shows a noise shaping characteristic.

DETAILED DESCRIPTION OF THE PREFERRED EMBODIMENTS

Hereinafter, embodiments of the present invention will be explained, referring to the accompanying drawings.

In a first embodiment of the present invention shown in FIG. 1, a mapping circuit 10 converts the supplied time-sequential digital signal into QPSK codes made up of I and Q signals. The I output terminal and Q terminal of the mapping circuit 10 are connected to an I- and Q-channel signal generators I-GEN and Q-GEN, respectively. The I- and Q-channel signal generators have the same circuit configuration. In this embodiment, a detailed explanation of the I-channel signal generator I-GEN will be given.

Figure 2:
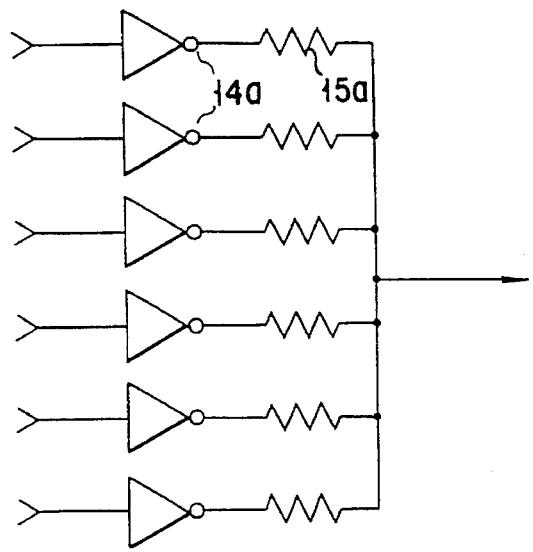
FIG. 2 is a circuit diagram of a current type D/A conversion circuit.

A signal input terminal 11 is connected to the input terminal of a data holding circuit 12 that retains the input data. The data holding circuit 12 comprises a plurality of switches 12a connected to the signal input terminal 11, a reference clock generator 12c that produces a reference clock signal to actuate the switches 12a in sequence, and a plurality of memories 12b connected to the switches 12a, respectively. The output terminals of the data holding circuit 12 are connected to the input terminals of a wave form forming circuit section 13 including a plurality of waveform forming circuits 13a that form the waveform of each piece of data supplied from each memory 12b. The output terminals of the plurality of waveform forming circuits 13a in the waveform forming circuit section 13 are connected to a plurality of D/A converters 14a of a D/A conversion circuit 14, respectively. The output terminals of the D/A converters 14a are connected to an out-band component eliminating circuit 16 via an adder circuit 15. The D/A conversion circuit 14 and adder circuit 15 are constructed by inverters 14a and resistors 15a, respectively, as shown in FIG. 2. The out-band component eliminating circuit 16 removes high-frequency components from the impulse-response analog addition result signal outputted from the adder circuit 15, and supplies an output signal at an output terminal 17.

With the signal generating apparatus thus constructed, in the data holding circuit 12, the inputted I (and Q) signal is supplied via the switch 12a, which is switched by a select signal from the reference clock circuit 12c, to the memory 12b with a state holding function such as a latch or a flip-flop, which stores the signal. The wave form forming circuit 13 stores the impulse response corresponding to the impulse response of the digital roll-off filter and outputs the impulse response corresponding to the signal transferred from the data holding circuit 12. The D/A conversion circuit 14 converts the digital impulse responses into analog signals. After the analog adder 15 adds the analog signals and outputs a sum signal, the out-band component eliminating circuit 16 removes high-frequency components from the sum signal and supplies a QPSK signal at the output terminal 17.

Because in a conventional signal generating apparatus, digital addition was performed in a stage prior to the A/D conversion circuit to add finite impulse responses, a digital adder was required. This made the scale of the circuit larger and consequently it was impossible to make the entire signal generator smaller. With the present invention, however, the adder 15 can be formed of an analog adder, making it possible to render the circuit scale far smaller than that of a digital adder. Accordingly, it is possible to make the circuit scale of the QPSK signal generating apparatus smaller.

When the arrangement of the D/A conversion circuit 14 and the analog adder 15 is modified and the analog data converted by each D/A converter 14a is expressed as a current value, the current outputs from the converters 14a can be added by connecting the output lines of the D/A converters 14a. Thus, the analog adder can be practically eliminated, thereby making it possible to further simplify the arrangement of the QPSK signal generating apparatus. Instead of using a current output-type converter as a D/A converter, the output of a voltage output-type D/A converter may undergo voltage-to-current conversion.

In the data holding circuit 12 of FIG. 1, the switches 12a are switched by a reference signal generated at the reference clock circuit 12c and the input signal is stored time-sequentially in the memories 12b, which convert the time-sequential data into parallel data. The converted data is supplied from the data holding circuit 12.

Figure 3:
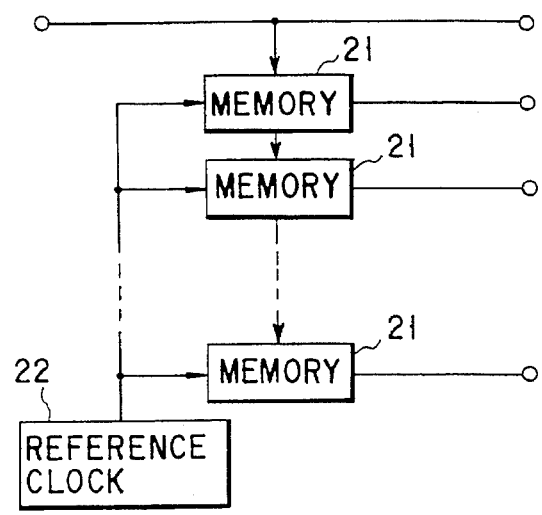
FIG. 3 is a circuit diagram of the data holding circuit of the signal generating apparatus in FIG. 1.

In a modification of the data holding circuit of FIG. 3, there are a plurality of memories 21 connected in series, and data is transferred from a memory to an adjacent memory each time a clock pulse arrives from the reference clock circuit 22. By transferring data from each of the memories 21, the time-sequential data is converted into parallel data. Therefore, the memory 21 functions as a delay element for the input signal, holds the time-sequential data, and converts the time-sequential data into parallel data. Accordingly, the memories 21 can be used as a data holding circuit.

When the data holding circuit of FIG. 3 is used, the arrangement of the waveform forming circuit section 13 is modified as follows. In the QPSK signal generating apparatus of FIG. 1, the waveform forming circuit section 13 stores the digital data almost corresponding to the impulse response of the digital roll-off filter.

Because the time-sequential data stored during a certain period of time is transferred in unison from the data holding circuit of FIG. 3, it is necessary to store the impulse response to each code of the QPSK signal in the waveform forming circuit section 13. Since the impulse responses to the input signal train contain portions overlapping each other in terms of time, the impulse responses are divided along the time axis and the data items corresponding to the divided components are stored in the waveform forming circuits 13a, respectively. The waveform forming circuits 13a transfer the signal corresponding to each data item according to the QPSK signal input. Because these data items are digital signals as in FIG. 1, they undergo a similar process as that performed on the signal in FIG. 1, and are converted by the D/A conversion circuit 14 into analog signals. The QPSK analog signals from the D/A converters 14a are added by the analog adder 15 and the addition result is supplied to the out-band component eliminating circuit 16. The out-band component eliminating circuit 16 removes out-band components from the added signal and sends the output signal.

Figure 4:
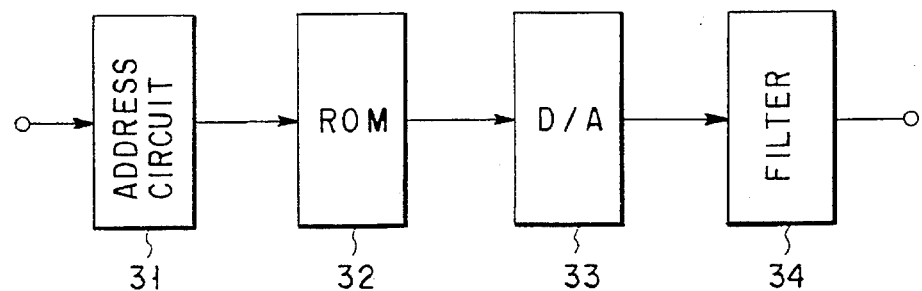
FIG. 4 is a block diagram of a signal generating apparatus according to a second embodiment of the present invention.

Referring to FIG. 4, a third embodiment of the present invention will be described.

Figure 5:
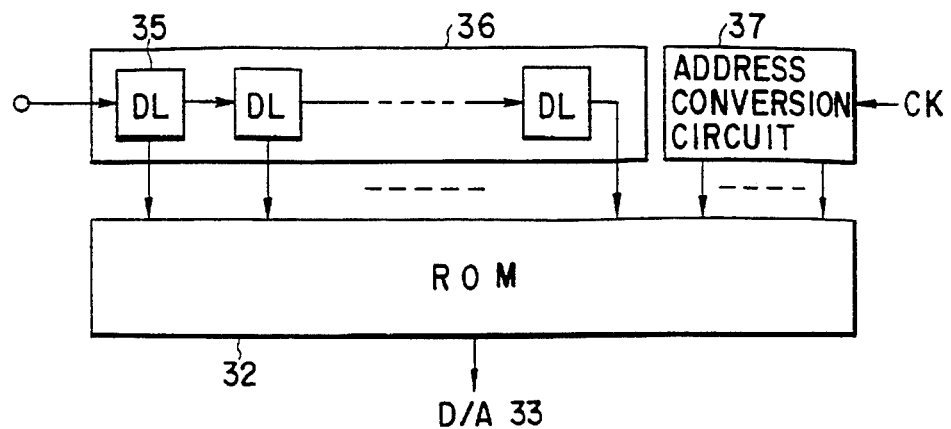
FIG. 5 is a block diagram of a signal generating apparatus according to a third embodiment of the present invention.

With this embodiment, the input signal is converted by a mapping circuit 10 as shown in FIG. 1 into a QPSK signal, which is then supplied to an address circuit 31 through an I channel and a Q channel separately. The address circuit 31 is connected to a ROM 32 and generates an address signal according to the input signal. The ROM 32 stores the impulse response according to the input signal and reads the impulse response according to the address signal corresponding to the input signal. Specifically, the address circuit 31 comprises a shift register 36 formed of a plurality of delay elements 35 connected in series and an address conversion circuit (counter) 37 as shown in FIG. 5. When a mapping signal is supplied to the first-stage delay element 35, the address conversion circuit 36 outputs an address signal in accordance with the signals stored in the individual delay elements 35. The ROM 32, when receiving the address signal corresponding to the input signal, outputs an impulse response to the A/D converter 33. The address conversion circuit 37 generates an address signal in synchronization with the clock signal.

The QPSK output signal is expressed as the sum of the impulse responses corresponding to the impulse responses of the digital roll-off filter to the input signals. In this embodiment, the ROM 32 stores the signal of the sum (super position) of the impulse responses according to each combination of QPSK signals. The contents of the ROM 32 are read in accordance with the address signal from the address circuit 31. This enables the data holding circuit 12 as shown in FIG. 1 to be constructed of a single ROM 32. The signal from the ROM 32 is converted by the D/A converter 33 into an analog signal, from which unwanted frequency components are removed. Then, the resulting signal is outputted as a QPSK signal.

A fourth embodiment of the present invention will be described with reference to FIG. 6.

The input signal has been converted by a mapping circuit (not shown) into a QPSK signal, which is then supplied to an address circuit 41. The address circuit 41 generates a plurality of address signals to reproduce a signal upon which the impulse responses according to the QPSK signal train supplied have been superposed. A ROM 42 stores the data on the impulse responses to be supplied to a plurality of D/A converters 45. Each memory element 44 (for example, each latch) of a data holding circuit 43 retains the data on the impulse responses read from the ROM 42 in accordance with the QPSK signal train supplied. The data items of impulse response which are specified by the address circuit 41 are read from the memory elements 44 and are then converted into analog signals. The converted signals are added to produce a signal upon which the impulse response data is superposed.

Figure 6:
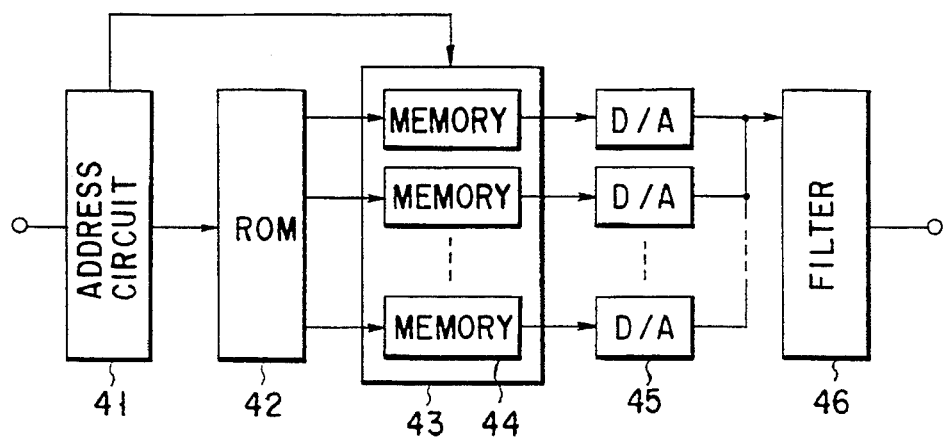
FIG. 6 is a block diagram of a signal generating apparatus according to a forth embodiment of the present invention.

According to the fourth embodiment of FIG. 6, the memory capacity of the ROM 42 may be equal to the memory capacity required for the first embodiment, because a plurality of impulse response data items can be stored in a single ROM by switching addresses. Since such structure does not require to make each impulse response correspond to a ROM, the memory capacitor of the ROM can be effectively utilized.

In this case, each of the memory elements 44 stores only the impulse response corresponding to the QPSK signal train supplied, which can be read in response to the clock signal. It is possible to obtain and store a ROM table corresponding to a plurality of impulse responses, and selectively output an impulse response according to the addressing. Further, while in this embodiment, the memory elements 44 are provided to store the data retained in the ROM 42, the memory elements 44 may be arranged so as to store the input signal train or to store the analog data after D/A conversion.

A fifth embodiment of the present invention will be described, referring to FIG. 7.

The input signal is converted into a QPSK signal by a mapping circuit (not shown). In a data holding circuit 51, the QPSK signal is stored in sequence in the memories 51b via switches 51a sequentially switched by the reference clock from a reference clock circuit 51c. A waveform forming circuit section 52 is controlled by the QPSK signal supplied. In the waveform forming circuit section 52, the impulse response subjected to filtering at an intercode interference eliminating filter and corresponding to the QPSK signal is modulated by an oversampling modulator represented by a $\Delta\Sigma$ modulator (refer to Akira Yukawa, "Oversampling A-D conversion technology," Nikkei BP Company) and is stored in each memory element in the form of a signal of a single bit or several bits in accordance with each QPSK signal.

The oversampling code is a code which can reduce the quantizing noise in the band by oversampling and noise shaping and express in-band signals at high accuracy in spite of the fact it is a single bit code. Therefore, by storing the above-described signal in the memory elements in the waveform forming circuit section 52, the circuit scale of the D/A converter 53 in the next stage is decreased remarkably. In addition to this, use of still another single-bit code provides a greater effect.

Namely, use of single-bit codes not only reduces the circuit scale because the code length of the D/A conversion circuit 53 is one bit, but also enables the D/A conversion circuit 53 to be formed of only switch elements, thus eliminating requirements for element accuracy. This makes it possible to construct a QPSK signal generating apparatus on an LSI easily. Further, use of oversampling codes alleviates the requirements for element accuracy for the filter 55, thereby reducing the circuit scale of the D/A conversion circuit 53 remarkably.

In this embodiment, the D/A conversion circuit 53 is of the current output type and the analog adder 54 is realized by connection of the output lines. This makes the analog adder 54 unnecessary. Because the output signal is a current, the filter 55 may be of the current input type. After the current output signal is converted into a voltage by a current-to-voltage circuit, the voltage may be supplied to the filter 55, which supplies an output.

Because the oversampling modulator used in this embodiment is of the voltage output type and outputs an analog signal, the circuit configuration can be made much smaller than that with a digital adder even if an analog adder is provided.

Figure 7:
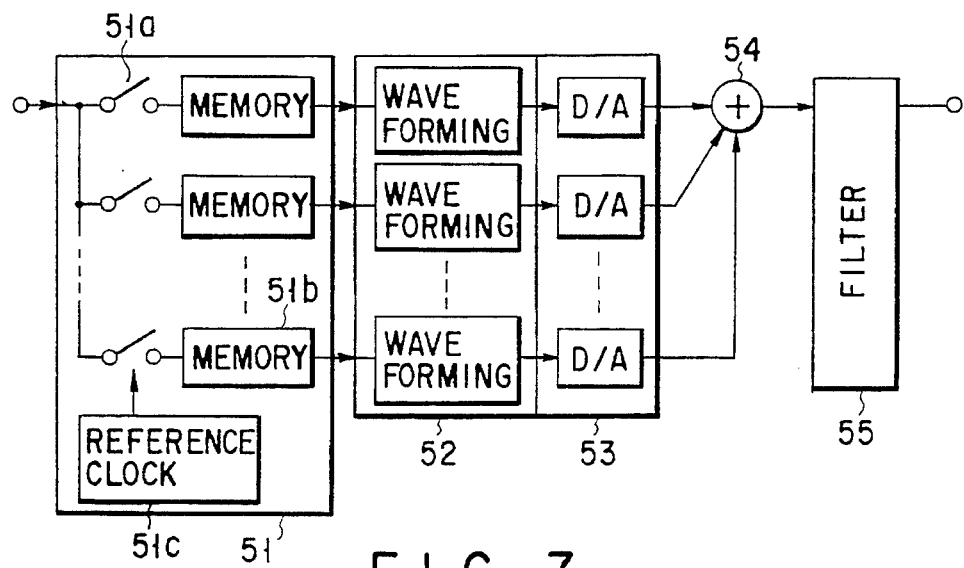
FIG. 7 is a block diagram of a signal generating apparatus according to a fifth embodiment of the present invention.

The data holding circuit 51 of FIG. 7 may be substituted by the data holding circuit shown in FIG. 3, provided that the data to be stored in the ROM differs depending on the type of holding circuit for the input data. When the data holding circuit 51 of FIG. 7 is used, the data obtaining by oversampling part of the result of multiplying the impulse response by a certain duration of window is stored in the ROM. In contrast to this, when the data holding circuit of FIG. 3 is used, the data obtained by oversampling the impulse response of the digital roll-off filter is stored in the ROM.

While in the above embodiment, four-phase QPSK signals are used, two-phase or eight-phase QPSK signals may be applied to the invention. The invention can be operated as a signal generator regardless of signal form.

A sixth embodiment will be described with reference to FIG. 8.

In this embodiment, an input terminal 61 to which a digital signal is supplied is connected to the input terminal of a mapping circuit 62. The I and Q signal output terminals of the mapping circuit 62 are connected to the input terminals of I and Q signal processing sections 63a and 63b, respectively. The I signal processing section 63a comprises a plurality of delay elements 64 connected in series to sequentially delay I signal from the mapping circuit 62, a plurality of ROMs 65, one of which is connected to the I signal output terminal of the mapping circuit 62 and the others of which are connected to the output terminals of delay elements 64, a plurality of D/A converters 66 connected to the output terminals of these ROMs 65 respectively, a plurality of weighting circuits 67 connected to the output terminals of these D/A converters 66 respectively, an adder 68 connected to the output terminals of these weighting circuits 67, and an out-band component eliminating filter 69 connected to the output terminal of the adder 68. The Q signal processing section 63b has the same circuit configuration as that of the I signal processing section 63a.

Figure 8:
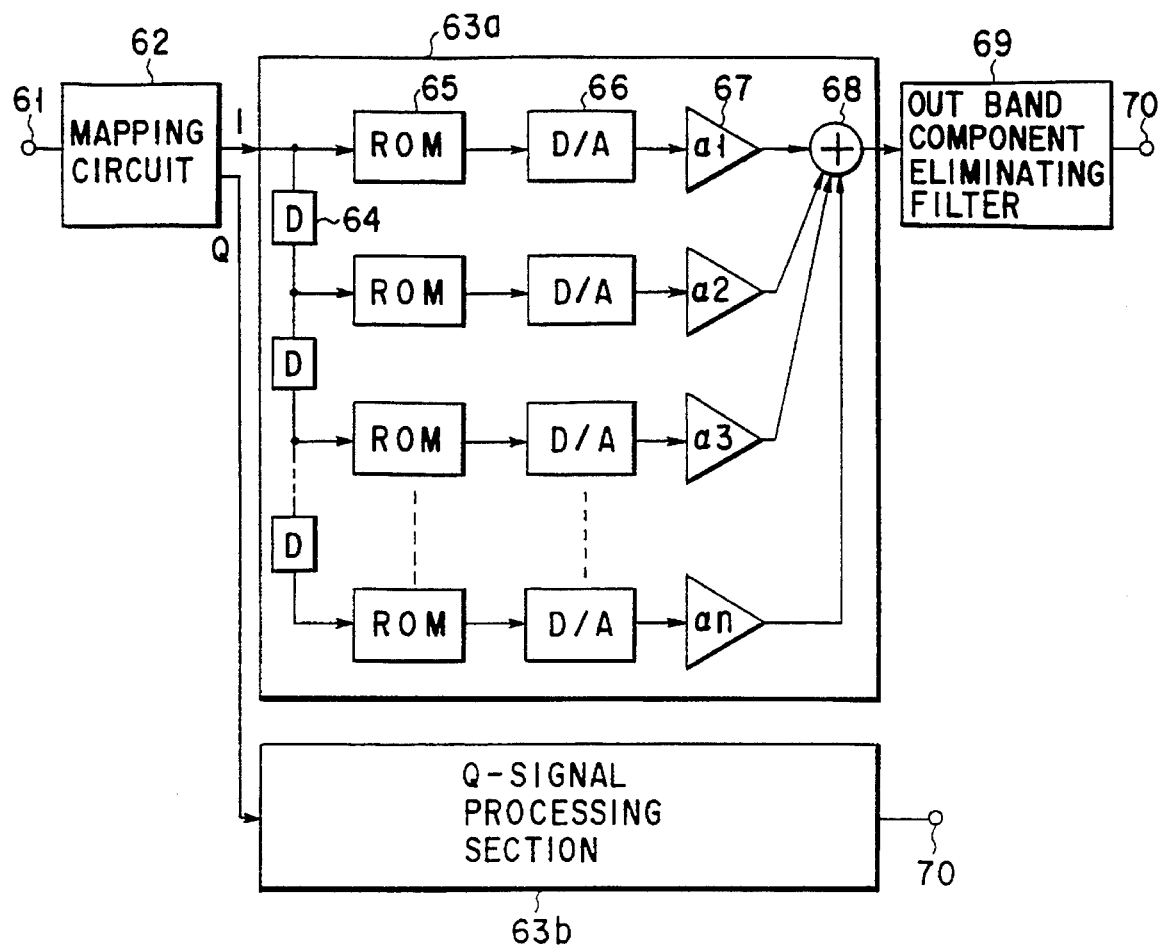
FIG. 8 is a block diagram of a signal generating apparatus according to a sixth embodiment of the present invention.
Figure 9:
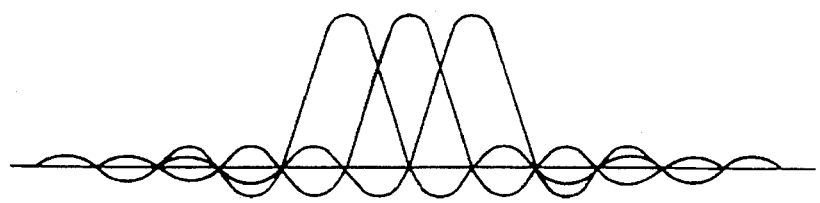
FIG. 9 shows a waveform of a impulse response.

In the sixth embodiment of FIG. 8, the digital signal supplied to the input terminal 61 is converted by the mapping circuit 62 into a QPSK signal made up of an I and Q signals. The ROMs 65 store the impulse responses corresponding to each code of the QPSK signal. The impulse responses to the input signal train contain overlapping portions as shown in FIG. 9. Because of this, the impulse responses are divided and stored in the ROMs 65 separately. That is, the QPSK signal is delayed by the delay elements 64 in sequence to produce divided QPSK signals, which are then stored in the plurality of ROMs 65 separately.

The output digital signals from these ROMs 65 are converted by the D/A converters 66 into analog signals and are multiplied by specified weights respectively at the weighting circuits 67. The weighted analog signals from the weighting circuits 67 are added by the adder 68. The added analog signal is supplied to the out-band component eliminating filter 69, which removes unwanted signal components and supplies an QPSK signal at the output terminal 70.

In this embodiment, the weight value of the weighting circuit 67 is varied according to the output waveform shown in FIG. 9. Specifically, where the amplitude is small, a small weight value $\alpha_n$ is set. In contrast, where the amplitude is great, a large weight value $\alpha_n$ is set. By multiplying the data stored in the ROM 65 by $1/\alpha_n$ (weight value) according to such a rule, the effect of quantizing noise can be reduced.

FIG. 10 shows a seventh embodiment of the present invention. In the seventh embodiment, a current output-type D/A converter is used as the D/A converter 66. The current outputs of these D/A converters 66 are connected with wires to form an adder. That is, use of current-type D/A converters eliminates the adder 68 of the sixth embodiment of FIG. 8, and wire connection of the outputs of D/A converters functions as an adder. This makes it possible to make the circuit scale of the analog adder. While in this embodiment, the D/A converter is of the current output type, the output of a voltage output-type D/A converter may undergo voltage-to-current conversion.

FIG. 11 shows an eighth embodiment of the present invention. In this embodiment, the input signal supplied to an input terminal 71 is converted by a mapping circuit 72 into a QPSK signal. The QPSK signal directly controls ROMs 75 via delay elements 74. The ROMs 75 correspond to the QPSK signals, respectively, and each store signals of one bit or several bits obtained by modulating the impulse response from an intercode interference eliminating filter with an oversampling modulator (refer to Akira Yukawa "Oversampling A-D conversion technology," Nikkei BP Company) represented by a $\Delta\Sigma$ modulator. Specifically, the output waveform Sa shown in FIG. 11 is divided into pieces and the divided portions Sd are converted into $\Delta\Sigma$ data items, which are stored in the ROMs 75. Each ROM 75 has five memory areas corresponding to values on the I axis of the IQ plane shown in FIG. 13, that is, 1, 1/√2, 0, −1/√2, and −1. These memory areas are addressed by I signal and the ΔΣ data item corresponding to I signal input is read out.

Figure 14:
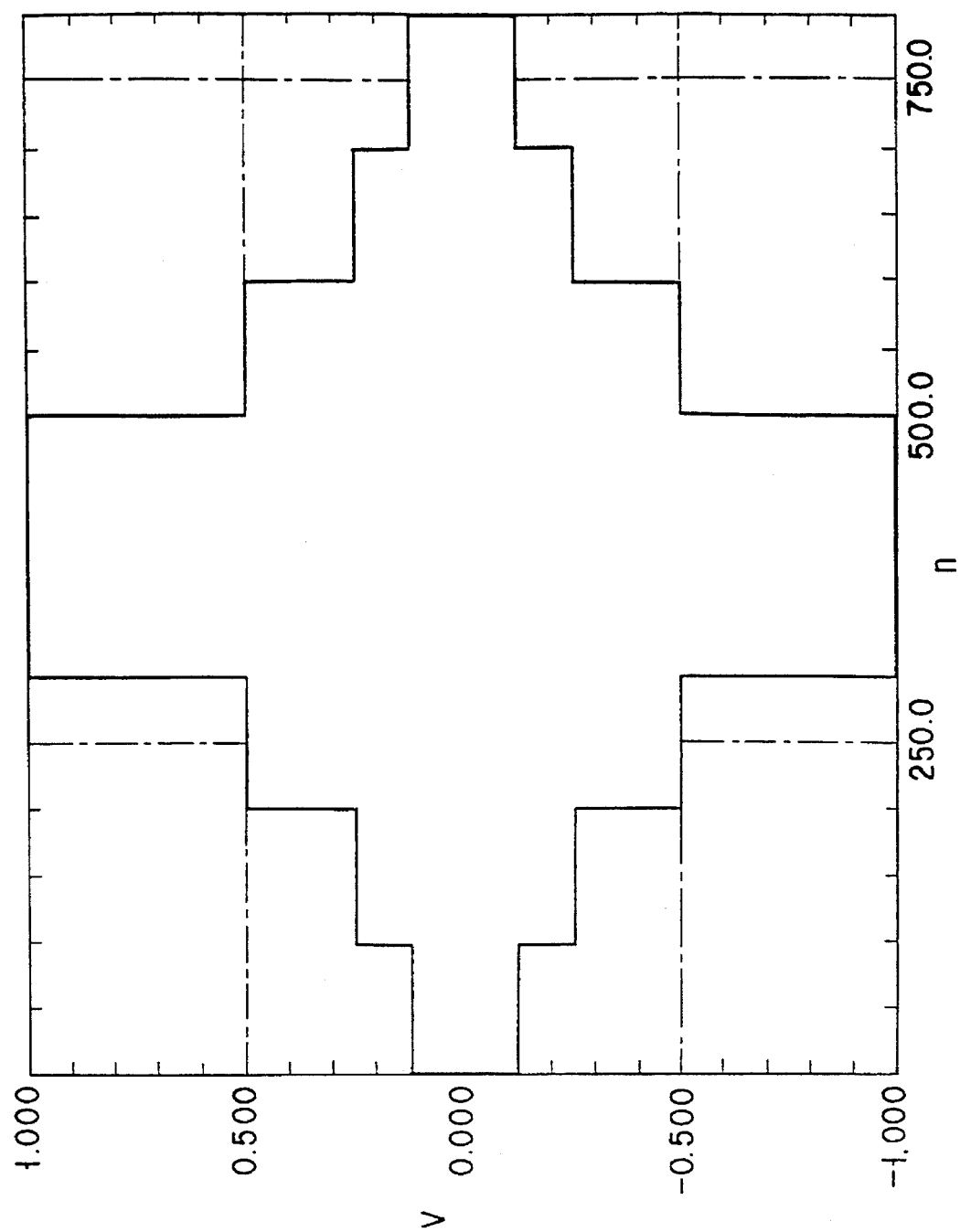
FIG. 14 shows a waveform of an impulse response.

By storing such signals in the ROMs 75, the circuit scale of the D/A converter is reduced remarkably. Use of single-bit codes decreases the circuit scale much more. Specifically, when single-bit codes are used, the code length of the D/A converter 76 is one bit. This not only reduces the circuit scale but also allows the D/A converter 76 to be formed of switch elements only, thereby eliminating requirements for element accuracy. Because of this, the QPSK signal generator can be constructed on an LSI easily. Further, use of oversampling codes alleviates the requirements for the performance of the filter 79. In this embodiment, the weight value $\alpha_n$ of the weighting circuit 77 is varied according to the output waveform. Specifically, where the amplitude is small, the weight value $\alpha_n$ is made small. In contrast, where the amplitude is large, the weight value $\alpha_n$ is made large. By multiplying the data stored in ROMs 75 by $1/\alpha_n$ according to such a rule, the effect of quantization can be decreased. The output waveform of one impulse response at that time has an amplitude having a stepwise envelope as shown in FIG. 14. As seen from the figure, the quantizing noise in the signal subjected to ΔΣ modulation can be reduced remarkably.

FIG. 15 shows a ninth embodiment of the present invention. In this embodiment, a D/A converter 76 is of the current output type and the adder in the eighth embodiment is replaced with the connection of the output lines of the D/A converters 76. Therefore, the circuit scale of this embodiment is smaller than that of the eight embodiment. Because the output signal is a current, the filter 79 may be of the current type. After the output signal is converted by a current-to-voltage converter into a voltage, the voltage may be supplied to a voltage-type filter.

With the signal generating apparatuses described above, quantization noise in the band can be reduced by noise shaping. From a different point of view, however, this means that noise outside the band increases. Thus, interference with other signals may become a problem. In this connection, an tenth embodiment capable of decreasing an adverse effect on other signals will be described in conjunction with FIGS. 16 to 18.

Briefly, by constructing a signal generating apparatus using an oversampling-type converter with such a noise shaping characteristic as suppresses the noise level in a specific frequency band, the level of unwanted noise in the specific frequency band can be suppressed, thereby alleviating the requirements for out-band blocking filters.

According to the circuit construction shown in FIG. 16, a digital signal supplied to an input terminal 81 is converted by a mapping circuit 82 into a QPSK signal made up of I and Q signals. Because I and Q signals are processed in the same way, only the processing of I signal will be explained. ROMs 85 store the impulse responses to each code of a QPSK signal, respectively. The impulse responses to an input signal train contain portions overlapping each other as shown in FIG. 9. Thus, the impulse responses are divided and stored in the ROMs separately. Delay elements 84 are used so that the QPSK signal may be supplied correctly to each ROM 85. The output digital signals from the individual ROMs are converted by D/A converters 86 into analog signals. The analog signals are added by an analog adder 88. The addition result is supplied to an out-band component eliminating filter, which supplies an output signal.

In a conventional signal generating apparatus, the above addition was carried out digitally in a stage prior to the D/A converter, resulting in the larger circuit scale. With this invention, the adder is realized by an analog adder, whose circuit scale is smaller than that of a digital adder. This makes it possible to reduce the circuit scale of a QPSK signal generator.

Figure 17:
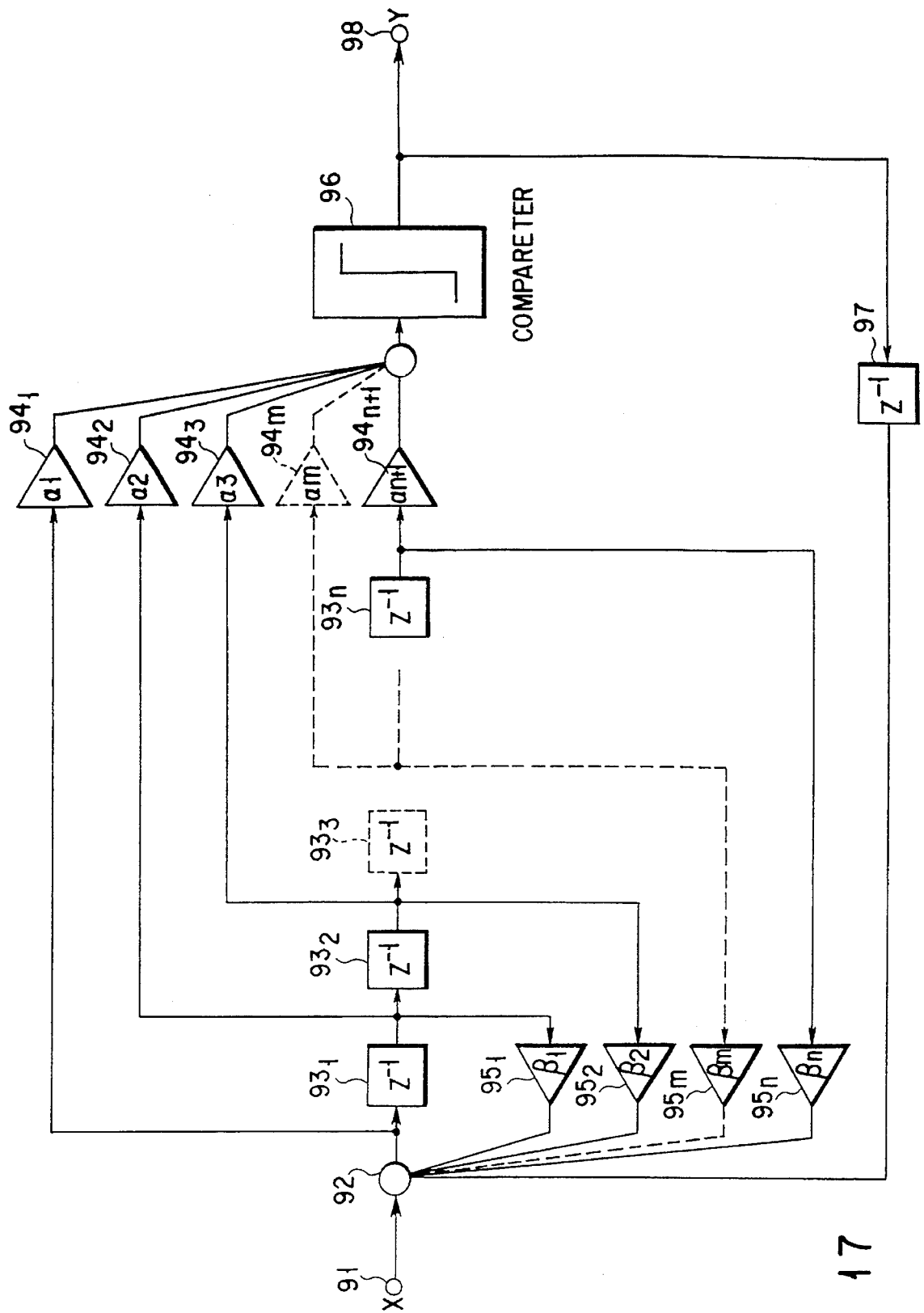
FIG. 17 is a circuit diagram of a n-th order $\Delta\Sigma$ modulator.

In the ROMs 85 of the signal generating apparatus of FIG. 16 are data items obtained by modulating a root roll-off signal by means of a ΔΣ modulator. The ΔΣ modulator comprises an adder 92 connected to an x input terminal 91, a plurality of delay circuits, i.e., $z^-$ circuits $93_1$ to $93_n$ connected in series, a plurality of α-coefficient circuits $94_1$ to $94_{n+1}$, a plurality of β-coefficient circuits $95_1$ to $95_n$, an adder 96, a comparator 97, and a delay circuit i.e., $z^{-1}$ circuit 98 as shown in FIG. 17.

The adder 92 adds the input signal, i.e., root roll-off signal, the output signals from β-coefficient circuits $95_1$ to $95_n$, and the $z^{-1}$ circuit 98, and supplies a sum signal to the first stage $z^{-1}$ circuit $93_1$ and α-coefficient circuits $94_1$. The $z^{-1}$ circuit $93_1$ delays the sum signal by a predetermined time and supplies the delay signal to the next stage $z^{-1}$ circuit $93_2$. That is, $z^{-1}$ circuit $93_1$ to $z^{-1}$ circuit $83_n$ delay the sum signal in turn and output respective delay signals. The α-coefficient circuits $94_1$ multiplies a coefficient $\alpha_1$ to the sum signal, and the α-coefficient circuits $94_2$ to $94_{n+1}$ multiply coefficients $\alpha_2$ to $\alpha_{n+1}$ to the output signals from the $z^{-1}$ circuits $93_2$ to $93_n$, respectively. The output signals from the α-coefficient circuits $94_1$ to $94_{n+1}$ are added by the adder 96. The sum signal from the adder 96 is supplied to the comparator 97 to compares with a threshold value. The output signal of the comparator 97 is transferred to a y output terminal 99 and the $z^{-1}$ circuit 98. the β-coefficient circuits $95_1$ to $94_n$ multiply coefficients $\beta^1$ to $\beta_n$ to the output signals from the $z^{-1}$ circuits $93_1$ to $93_n$, respectively. The output signals from the α-coefficient circuits $95_1$ to $95_n$ and the output signal from the $z^{-1}$ circuit 98 are added by the adder 92.

The above ΔΣ modulator is given such a noise shaping characteristic as to suppress noise at a frequency at which interference should be prevented as shown in FIG. 18. In order to obtain the characteristic, a transfer function from x-input to y-output is assumed to be expressed as:

$$y=a(z)x+b(z)Q$$

where Q is quantizing noise generated at a quantizer.

In the above equation, by setting α and β so that b(z) may have a zero at a frequency at which interference should be prevented, the above noise shaping characteristic can be achieved. For example, to set two zeros at fs/m in the case of a forth-order ΔΣ modulator, α and β only have to be set so as to give:

$$b(z)=(1-z^{-1})^2(1-2\cos(\pi/m)z^{-1}+z^{-2})$$

FIG. 18 shows a noise shaping characteristic with a zero at 600 kHz. AS seen from the figure, noise is reduced in the vicinity of a frequency of 600 kHz at which interference will occur. In a conventional signal generator, it was necessary to suppress this noise sufficiently with a filter in the rear stage. With the present invention, requirements for the characteristics of filters can be relaxed, which is helpful in making the system more compact.

The eleventh embodiment is constructed by connecting coefficient circuits 87 shown by dashed lines to the output terminals of the D/A converters 87 of the tenth embodiment, respectively. With this arrangement, the noise characteristic can be improved further by making the amplitude at the D/A converter small to reduce the quantizing noise itself where the amplitude of the response of the roll-off filter is small.

The arrangement using the converter whose noise shaping characteristic is improved as described above can be applied similarly to the embodiments shown in FIGS. 1, 4, 5, 6, 7, 8, 10, 11, and 15.

While in the above embodiments, QPSK signal generating apparatuses are used, the present invention is not limited to this type of signal generating apparatus, but may be applied regardless of the signal type.

The present invention does not require a large digital adder traditionally needed, thereby reducing the circuit scale. Further, with the invention, use of current output-type D/A converters enables not only the reduction of the circuit scale but also the remarkable alleviation of requirements for accuracy of circuit elements. This makes it easier to form signal generators on VLSIs, resulting in an improved yield and consequently a reduction in the production cost.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A signal generating apparatus comprising:

signal conversion means for converting a time-sequential input signal into a time-sequential digital signal;

signal holding means for dividing the time-sequential digital signal from said signal conversion means into a plurality of digital signals, retaining said signals, and outputting said signals in parallel;

waveform forming means for outputting a plurality of waveform data corresponding to the plurality of digital signals from said signal holding means respectively;

a current conversion-type D/A converter for converting the plurality of waveform data from said waveform forming means into a plurality of current signals;

addition means for adding the plurality of current signals from said D/A conversion means and outputting a sum signal; and filter means for removing predetermined high frequency components from the sum signal from said addition means.

2. A signal generating apparatus according to claim 1, wherein said waveform forming means comprises a plurality of memories which store the plurality of waveform data corresponding to the plurality of digital signals from said signal holding means, respectively.

3. A signal generating apparatus according to claim 1, wherein said signal conversion means includes a mapping circuit for converting said input signal into I and Q signals constituting a QPSK code, and said signal holding means includes a plurality of signal holding circuits which each retain said I and Q signals.

4. A signal generating apparatus according to claim 1, wherein the addition means adds the current signals by sending the current signals to a common node.

5. A signal generating apparatus comprising:

signal conversion means for converting a time-sequential input signal into a time-sequential digital signal;

signal holding means for dividing the time-sequential digital signal from said signal conversion means into a plurality of digital signals including a first and a second digital signal, retaining the signals, and outputting the signals in parallel;

waveform forming means which contains a plurality of memories for storing a plurality of $\Delta\Sigma$ modulation data corresponding to the plurality of digital signals from said signal holding means, respectively;

a current conversion-type D/A converter for converting the plurality of $\Delta\Sigma$ conversion data from said plurality of memories into a plurality of current signals;

addition means for adding the plurality of current signals from said D/A conversion means and outputting a sum current signal; and filter means for removing predetermined frequency components from the sum current signal from said addition means.

6. A signal generating apparatus according to claim 5, wherein the $\Delta\Sigma$ conversion data stored in said memories are noise shaping codes of said input signal, and said D/A conversion means comprises a D/A converter circuit with a one-bit code length.

7. A signal generating apparatus according to claim 5, wherein said signal conversion means includes a mapping circuit for converting said input signal into I and Q signals constituting a QPSK code, and said signal holding means includes a plurality of signal holding circuits which each retain said I and Q signals.

8. A signal generating apparatus according to claim 5, wherein the $\Delta\Sigma$ data stored in said memories are produced from a $\Delta\Sigma$ having a noise shaping characteristic with an attenuation characteristic in a predetermined frequency.

9. A signal generating apparatus comprising:

signal conversion means for converting a time-sequential input signal into a time-sequential digital signal;

signal holding means for dividing the time-sequential digital signal from said signal conversion means into a plurality of digital signals, retaining them, and outputting them in parallel;

plurality of waveform forming means for outputting plurality of waveform data corresponding to the plurality of digital signals from said signal holding means respectively;

D/A conversion means for converting the waveform data items from said waveform forming means into a plurality of analog signals;

weighting means for multiplying each of the plurality of analog signals from said D/A conversion means by a weighting coefficient according to a waveform of each of the analog signals, and outputting a weighted analog signal;

addition means for adding the weighted analog signals from said weighting means and outputting a sum signal; and filter means for removing predetermined high frequency components from the sum signal from said addition means.

10. A signal generating means according to claim 9, wherein said weighting means multiplies an analog signal whose amplitude is made small by a smaller weighting coefficient than that for an analog signal whose amplitude is large.

11. A signal generating means according to claim 9, wherein said signal holding means contains memory means for storing a bit signal obtained by performing oversampling modulation of an impulse response corresponding to said digital signal.

12. A signal generating means according to claim 11, wherein said waveform forming means contains a plurality of memories which store plurality of waveform data obtained by performing $\Delta\Sigma$ modulation of the impulse responses corresponding to the plurality of digital signals from said signal holding means.

13. A signal generating means according to claim 9, wherein said D/A conversion means comprises a current conversion-type D/A conversion circuit for converting the plurality of waveform data from said waveform forming means into a plurality of current signals, and said addition means includes an adder circuit for adding said current signals.

14. A signal generating apparatus according to claim 9, wherein said signal conversion means includes a mapping circuit for converting said input signal into I and Q signals constituting a QPSK code, and said signal holding means includes a plurality of signal holding circuits which each retain said I and Q signals.

15. A signal generating apparatus according to claim 5, wherein the addition means adds the current signals by sending the current signals to a common node.

* * * * *